United States Patent
Ma et al.

[11] Patent Number: 5,998,248
[45] Date of Patent: Dec. 7, 1999

[54] FABRICATION OF SEMICONDUCTOR DEVICE HAVING SHALLOW JUNCTIONS WITH TAPERED SPACER IN ISOLATION REGION

[75] Inventors: William Hsioh-Lien Ma, Fishkill; Hsing-Jen C. Wann, Yorktown Heights, both of N.Y.

[73] Assignee: International Business Machines Corporation, Armonk, N.Y.

[21] Appl. No.: 09/236,693

[22] Filed: Jan. 25, 1999

[51] Int. Cl.⁶ .................... H01L 21/8238; H01L 21/336
[52] U.S. Cl. ................. 438/231; 438/231; 438/297; 438/300; 438/301; 438/978
[58] Field of Search .................... 438/231, 300, 438/301, 978, 297

[56] References Cited

U.S. PATENT DOCUMENTS

| | | |
|---|---|---|
| 4,016,587 | 4/1977 | De La Moneda . |
| 4,072,545 | 2/1978 | De La Moneda . |
| 4,471,524 | 9/1984 | Kinsbron et al. . |
| 4,503,601 | 3/1985 | Chiao . |
| 4,663,191 | 5/1987 | Choi et al. . |
| 4,826,782 | 5/1989 | Sachitano et al. . |
| 4,841,347 | 6/1989 | Hsu . |
| 4,873,205 | 10/1989 | Critchlow et al. . |
| 5,153,145 | 10/1992 | Lee et al. . |
| 5,168,072 | 12/1992 | Moslehi . |
| 5,242,847 | 9/1993 | Ozturnk et al. . |
| 5,268,317 | 12/1993 | Schwalke et al. . |
| 5,316,977 | 5/1994 | Kunishima et al. . |
| 5,324,684 | 6/1994 | Kermani et al. . |
| 5,340,770 | 8/1994 | Allman et al. . |
| 5,352,631 | 10/1994 | Sitaram et al. . |
| 5,391,508 | 2/1995 | Matsuoka et al. . |
| 5,393,687 | 2/1995 | Liang . |
| 5,395,787 | 3/1995 | Lee et al. . |
| 5,407,847 | 4/1995 | Hayden et al. . |
| 5,413,957 | 5/1995 | Byun . |
| 5,428,240 | 6/1995 | Lur . |
| 5,432,105 | 7/1995 | Chien . |
| 5,439,831 | 8/1995 | Schwalke et al. . |
| 5,457,060 | 10/1995 | Chang . |
| 5,466,615 | 11/1995 | Tsai . |
| 5,478,776 | 12/1995 | Luftman et al. . |
| 5,536,676 | 7/1996 | Cheng et al. . |
| 5,545,579 | 8/1996 | Liang et al. . |
| 5,559,357 | 9/1996 | Krivokapic . |
| 5,569,624 | 10/1996 | Weiner . |
| 5,571,735 | 11/1996 | Mogami et al. . |
| 5,571,738 | 11/1996 | Krivokapic . |
| 5,620,912 | 4/1997 | Hwang et al. . |
| 5,623,153 | 4/1997 | Liang et al. . |
| 5,624,867 | 4/1997 | Cheng et al. . |
| 5,646,435 | 7/1997 | Hsu et al. . |
| 5,650,347 | 7/1997 | Choi . |
| 5,668,024 | 9/1997 | Tsai et al. . |
| 5,672,541 | 9/1997 | Booske et al. . |
| 5,677,213 | 10/1997 | Lee . |
| 5,677,214 | 10/1997 | Hsu . |
| 5,679,589 | 10/1997 | Lee et al. . |
| 5,683,920 | 11/1997 | Lee . |
| 5,691,212 | 11/1997 | Tsai et al. . |
| 5,698,881 | 12/1997 | Yoshitomi et al. . |
| 5,747,356 | 5/1998 | Lee et al. . |
| 5,753,548 | 5/1998 | Yu et al. . |
| 5,757,045 | 5/1998 | Tsai et al. . |
| 5,766,998 | 6/1998 | Tseng . |
| 5,780,901 | 7/1998 | Yoshitomi et al. . |

*Primary Examiner*—John F. Niebling
*Assistant Examiner*—Ron Pompey
*Attorney, Agent, or Firm*—Pollock, Vande Sande & Amernick; Joseph P. Abate

[57] ABSTRACT

A semiconductor device having shallow junctions is provided by providing a semiconductor substrate having source and drain regions and polysilicon gate regions; depositing selective silicon on the source and drain regions; providing dopant into the source and drain regions forming shallow junctions; forming first insulating spacers on sidewalls of the gate regions; forming second insulating sidewall spacers on the first insulating spacers; and siliciding the top surfaces of the source and drain regions and polysilicon gate regions.

18 Claims, 3 Drawing Sheets

5,998,248

FABRICATION OF SEMICONDUCTOR DEVICE HAVING SHALLOW JUNCTIONS WITH TAPERED SPACER IN ISOLATION REGION

TECHNICAL FIELD

The present invention relates to a process for fabricating semiconductor devices, and more particularly to a process of fabricating ultrashallow junctions along with desired separation and isolation between the source and drain regions and the gate regions. The process of the present invention provides devices having ultrashallow junctions along with high conductivity gates.

BACKGROUND OF INVENTION

In the formation of semiconductor devices, the desire to fabricate smaller devices and denser integrated circuits continues as an important objective. Producing microelectronic devices having dimensions which are small enough to meet the requirements of ultralarge-scale integration (ULSI) requires reducing both the lateral and vertical dimensions of the devices in a semiconductor substrate. For instance, as the device sizes become smaller, a need exists for forming shallow regions of a desired conductivity at the face of the semiconductor substrate. In fabricating metal oxide semiconductor field effect transistors (MOSFET), especially for logic devices, in addition to forming shallow junctions, an important concern relates to separating and isolating the source/drain regions from the gate regions.

SUMMARY OF INVENTION

It is therefore an object of the present invention to provide a method for fabricating semiconductor device having ultrashallow junction along with desired separation and isolation between source/regions and gate regions.

The present invention provides a process sequence for fabricating a semiconductor device that achieves the above objectives. More particularly, the method of the present invention comprises providing a semiconductor substrate having source and drain regions and polysilicon gate regions. Selective silicon is deposited on the source and drain regions. Dopant is provided into the source and drain regions forming shallow junctions. First insulating sidewall spacers are formed on sidewalls of the gate regions. Second insulating spacers are formed on top of the first insulating sidewall spacers. The top surfaces of the source and drain regions and polysilicon gate regions are then silicided.

The present invention also relates to semiconductor devices obtained by the above-described process.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWING

The foregoing and other objects, aspects and advantages of the present invention will be better understood from the following detailed description of a preferred embodiment of the invention with reference to the drawings, in which.

BEST AND VARIOUS MODES FOR CARRYING OUT INVENTION

Figure 1:
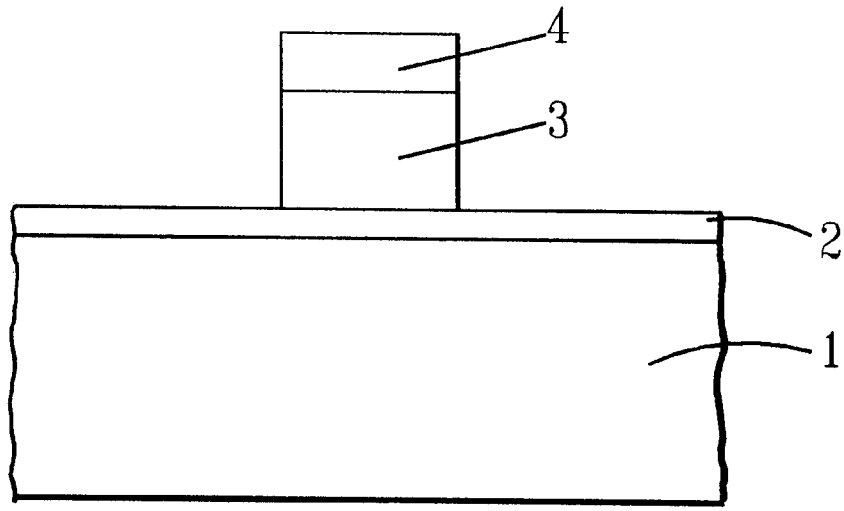
FIGS. 1–7 are schematic diagrams of a structure in accordance with the present invention in various stages of the processing according to an embodiment of the present invention.

In order to facilitate an understanding of the present invention, reference will be made to the figures which illustrate a diagrammatic representation of the steps of an embodiment according to the present invention.

According to the present invention, an insulating layer is provided on a semiconductor substrate 1. The semiconductor substrate is typically monocrystalline silicon or a SOI substrate (silicon on insulator). The insulating layer 2 can be grown on the substrate or can be provided by deposition techniques such as chemical vapor deposition (CVD) or physical vapor deposition (PVD). Also, the insulating layer 2 can be provided by thermal oxidation of the underlying substrate 1 to provide a silicon dioxide. Typically, this layer 2 is about 15 to about 100 Å thick and acts as a gate insulator.

A conductive material 3 such as a doped polycrystalline silicon layer is provided on the insulating layer 2. The conducting layer 3 provides gate electrodes in the semiconductor devices which are to be formed on the semiconductor substrate. Typically, the conductive layer 3 is about 1000 to about 3000 Å thick.

A second insulating layer 4 is optionally provided on the conductive layer 3. Typically, this layer is up to about 1500 Å thick. This insulating layer 4 is generally an oxide which can be formed for instance by oxidation of a deposited tetraethylorthosilicate, followed by heating to a temperature of about 400° C. to about 750° C. to form the oxide or more commonly by chemical vapor deposition.

Selected portions of the second insulating layer 4 and conductive layer 3 are removed by etching in a predetermined pattern for defining the gate conductor. In particular, the portions can be removed by employing conventional photolithographic techniques such as providing a photosensitive resist material (not shown) and then patterning it to provide the desired gate structure. The patterned photoresist then acts as a mask for removing exposed portions of the second insulating layer 4 and then the conductive layer 3. These can be removed by reactive ion etching. It is desired that the insulating layer 4 be of a different material than the insulation 2 so that the removal can be carried out to selectively stop on the insulation layer 2.

Next, the photoresist remaining is removed by for instance dissolving in a suitable solvent.

Figure 2:
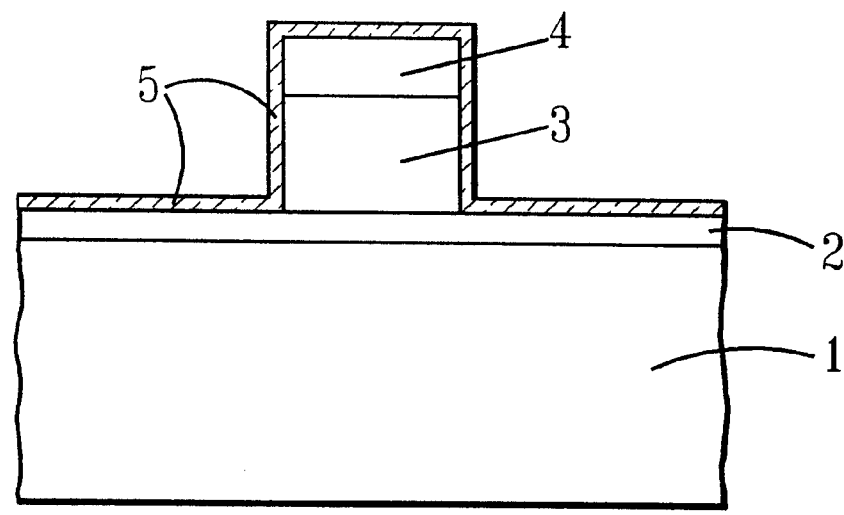

Next, a third insulating layer 5 is provided such as by known deposition techniques including chemical vapor deposition or physical vapor deposition. Typically, layer 5 is silicon dioxide, silicon nitride or silicon oxynitride. This layer is typically about 10 to about 300 Å thick. See FIG. 2.

Figure 3:
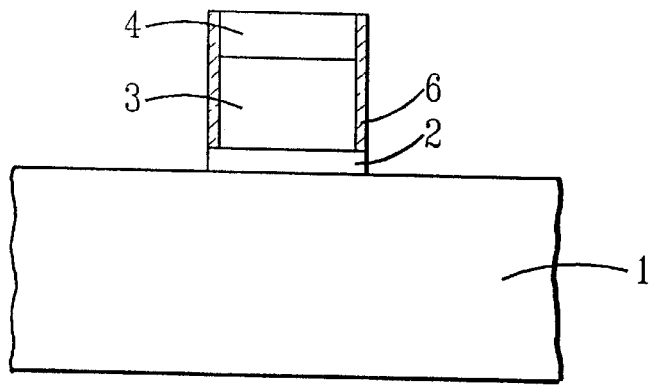

Next, the insulating layer 5 is removed as shown in FIG. 3 from the top of insulator 4 and the top of the insulating layer 2 while leaving insulation 6 on sidewalls of the gate conductor 3. In addition, insulating layer 2 is removed except for those portions located beneath the gate structure 3 and insulation 6. The removal can be carried out by selective reactive ion etching whereby the etching selectively stops on the underlying silicon substrate. The thickness of insulation 6 controls the overlap of the junction to be subsequently formed which is its vertical diffusion as well as lateral diffusion.

Figure 4:
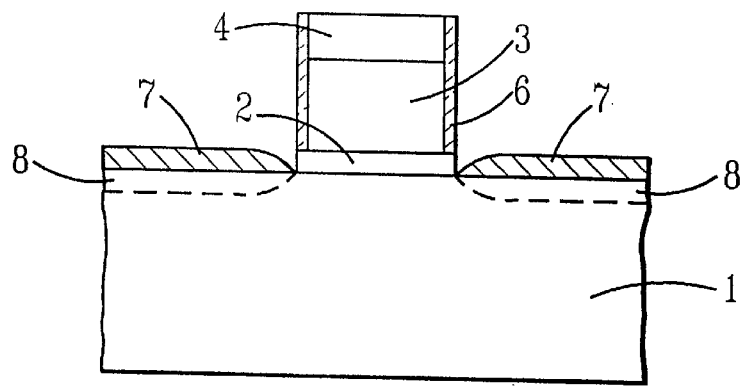

A selective silicon layer 7 is deposited and grown such as by chemical vapor deposition. The silicon layer 7 is an epitaxial silicon layer and results in monocrystalline silicon on exposed monocrystalline silicon surfaces. The silicon is selective in that it grows only where silicon surfaces are exposed. The layer 7 is typically about 100 to about 500 Å thick. See FIG. 4.

The selective silicon layer 7 can be doped or undoped. When doped, the dopant is then driven through the selective silicon layer 7 into the source and drain regions 8 to provide shallow junctions of typically less than 200 Å and more typically about 50 to about 150 Å. In order to ensure the formation of an ultrashallow junction, the structure is subjected to a short, rapid thermal anneal (RTP) which is typically at temperatures of about 800 to about 1200° C., and more typically about 900 to about 1100° C. for about 0.05 to about 1.00 mins, and more typically about 0.2 to about 0.5 mins. When the silicon layer 7 is undoped or relatively lightly doped, dopant ions are implanted through the selective silicon layer 7 into the source and drain regions 8 to form the shallow junctions. In the case when the silicon layer 7 is lightly doped, dopants from it can be driven through layer 7 in the source and drain regions in addition to implanting dopant ions through silicon layer 7.

Typically p-type dopants for silicon are boron, aluminum, gallium and indium. Typical n-type dopants for silicon are arsenic, phosphorous and antimony. The dopants are typically implanted at dosages of about 1E13 to about 1E16 atoms/$cm^2$, and more typically about 5E13 to about 2E15 atoms/$cm^2$ and at energies of about 1 to about 20 keV.

Figure 5:
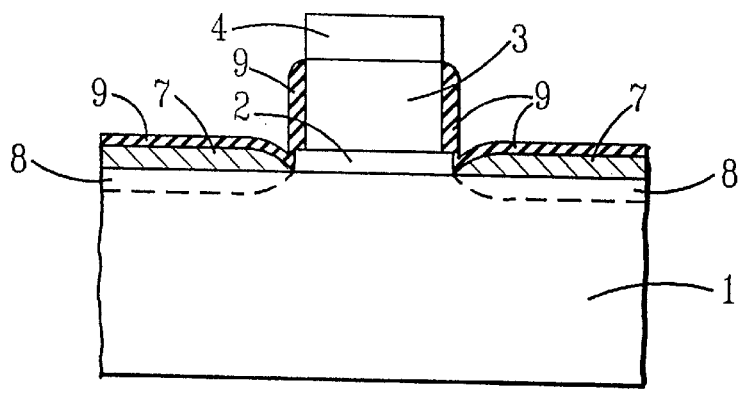

The sidewall insulating layer 6 can then be removed such as by etching in a etchant which is selective to the silicon and polysilicon. However, it is not necessary to remove layer 6 and such can remain, if desired. As illustrated in FIG. 5, an oxide layer 9 is then grown by oxidation of the exposed silicon and polysilicon by heating at temperatures of about 700 to about 900° C. As illustrated in FIG. 5, this creates insulating sidewall spacers on sidewalls of the gate 3 and a taper-shaped isolation where the source/drain regions 8 meet the gate conductor 2 in order to reduce the capacitance. Furthermore, this ensures a relatively narrow separation and insulation between the source/drain regions 8 and the gate conductor 3. The insulating sidewall spacers 9 are typically about 20 to about 100 Å thick.

Next, second insulating spacers 10 are formed on the sidewall spacers 9 such as by chemical vapor deposition or physical vapor deposition. This insulating layer 10 can be silicon dioxide or silicon nitride or silicon oxynitride. This layer is typically about 500 to about 2000 Å thick. The oxide layer 9 not covered by the insulating spacer layer 10 is removed by reactive ion etching which selectively stops on the selective silicon 7.

In addition, the insulating layer 4 is removed from the top of the polysilicon gate 3. Such can be removed by reactive ion etching or wet chemical etch.

Figure 6:
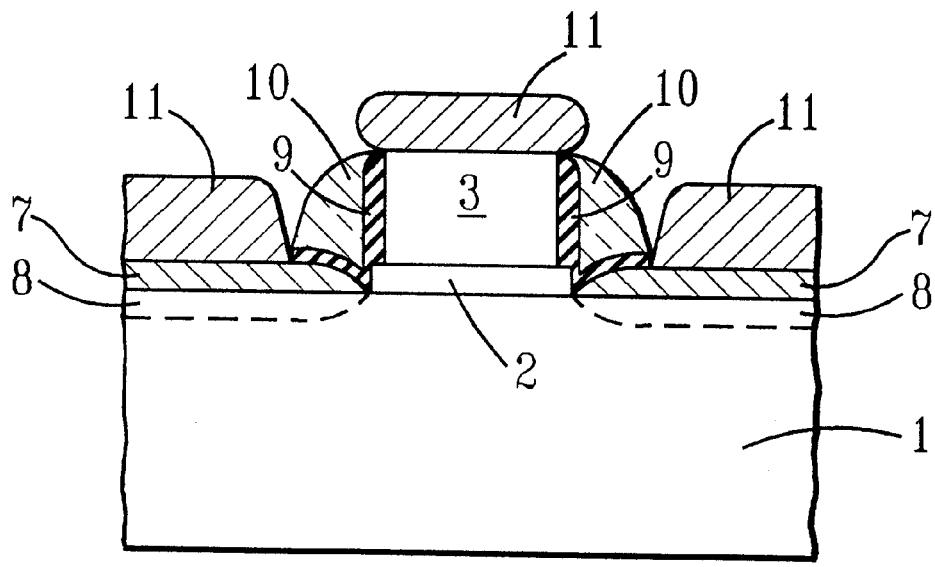

A second selective silicon layer 11 is deposited and grown such as by chemical vapor deposition. The silicon layer 11 is an epitaxial silicon layer and results in monocrystalline silicon on exposed monocrystalline silicon surfaces and amorphous silicon on the polysilicon surfaces. The silicon is selective in that it grows only where silicon surfaces are exposed. The layer 11 is typically about 100 to about 500 Å thick. See FIG. 6.

Figure 7:
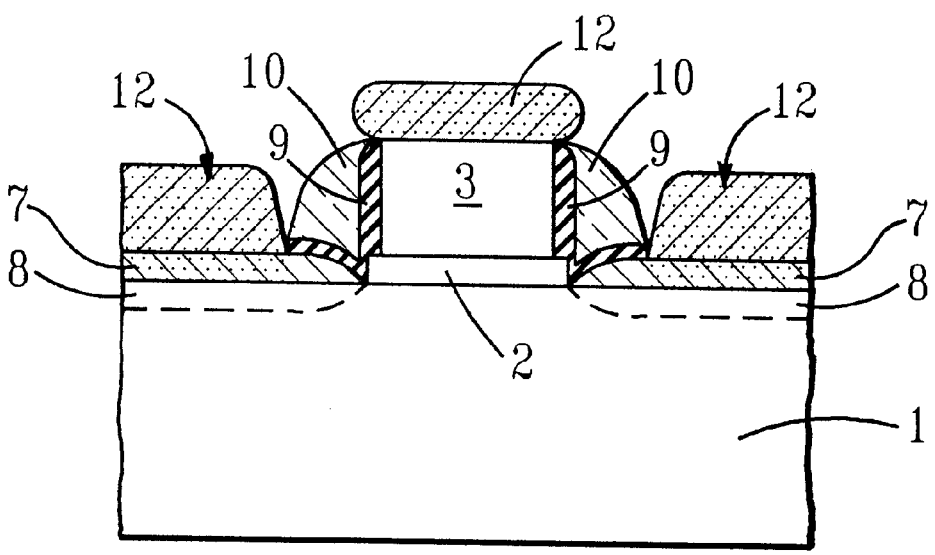

A silicide forming metal such as tungsten, titanium, cobalt or nickel is then deposited on the exposed silicon and polysilicon surfaces. The metal is typically deposited by vapor deposition or spatter techniques. See FIG. 7. The metal reacts with the underlying monocrystalline or polycrystalline silicon to form the corresponding metal silicide 12. The silicide reduces the resistivity in the gate conductor.

If desired, the device can then be subjected to conventional processing in order to form contacts and wiring to provide the desired finished device.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for fabricating a semiconductor device having shallow junctions comprising:

providing a semiconductor substrate having source and drain regions and polysilicon gate regions;

depositing selective silicon on the source and drain regions;

providing dopant into the source and drain regions forming shallow junctions;

forming first insulating sidewall spacers on sidewalls of the gate regions by thermal oxidation of exposed silicon creating taper-shaped isolation where the source and drain regions meet the gate regions;

forming second insulating spacers on the first insulating sidewall spacers; and siliciding the top surfaces of the source and drain regions and polysilicon gate regions.

2. The method of claim 1 wherein the selective silicon layer is doped and the shallow junctions are formed by driving in dopant from the selective silicon into the source and drain regions.

3. The method of claim 2 which comprises employing a short rapid thermal anneal for driving in the dopant.

4. The method of claim 3 wherein the short rapid thermal anneal is carried out at temperatures of about 800 to about 1200 for about 0.05 to about 1 minute.

5. The method of claim 1 wherein the selective silicon layer is undoped and the shallow junctions are formed by implanting dopant ions into the source and drain regions.

6. The method of claim 1 wherein the shallow junctions are less than 200 Å.

7. The method of claim 1 wherein the shallow junctions are about 50 to about 150 Å.

8. The method of claim 1 wherein the first insulating sidewall spacers are about 20 to about 100 Å thick.

9. The method of claim 1 wherein the second insulating sidewall spacers are selected from the group consisting of silicon dioxide, silicon nitride, silicon oxynitride and mixtures thereof.

10. The method of claim 9 wherein the second insulating sidewall spacers are about 500 to about 2000 Å thick.

11. The method of claim 1 wherein said silicide forming metal is selected from the group consisting of tungsten, titanium, cobalt, nickel and mixtures thereof.

12. The method of claim 1 which further comprises gate insulation between the substrate and the gate regions.

13. The method of claim 1 which further comprises providing sidewall insulating layers on sidewalls of the gate regions prior to depositing the selective silicon layer.

14. The method of claim 13 which further comprises removing the sidewall insulating layer after forming the shallow junctions and prior to forming the first insulating sidewall spacers.

15. The method of claim 14 wherein the sidewall insulating layer is about 10 to about 300 Å thick.

16. The method of claim 1 which comprises providing insulating cap on the gate regions prior to depositing selective silicon on the source and drain regions.

17. The method of claim 16 which further comprises removing the insulating cap after forming the second insulating spacers and prior to the siliciding.

18. The method of claim 17 which further comprises providing a second selective silicon layer subsequent to removing the insulating cap, wherein the second selective silicon layer is provided on exposed monocrystalline silicon surfaces above source and drain regions and on polysilicon gate regions.

* * * * *